United States Patent
van den Tillaart et al.

(10) Patent No.: US 11,981,987 B2
(45) Date of Patent: May 14, 2024

(54) NOZZLE EXIT CONTOURS FOR PATTERN COMPOSITION

(71) Applicant: Universal Display Corporation, Ewing, NJ (US)

(72) Inventors: Edwin van den Tillaart, Eindhoven (NL); Sven Pekelder, Eindhoven (NL); Mark Meuwese, Eindhoven (NL); William E. Quinn, Whitehouse Station, NJ (US); Gregory McGraw, Yardley, PA (US); Gregg Kottas, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 85 days.

(21) Appl. No.: 17/510,529

(22) Filed: Oct. 26, 2021

(65) Prior Publication Data

US 2022/0042165 A1 Feb. 10, 2022

Related U.S. Application Data

(63) Continuation of application No. 15/475,408, filed on Mar. 31, 2017, now Pat. No. 11,168,391.
(Continued)

(51) Int. Cl.
*C23C 14/24* (2006.01)
*C23C 14/12* (2006.01)
(Continued)

(52) U.S. Cl.
CPC .............. *C23C 14/24* (2013.01); *C23C 14/12* (2013.01); *C23C 16/45517* (2013.01);
(Continued)

(58) Field of Classification Search
CPC ............ C23C 16/45565; C23C 16/545; C23C 16/45563; C23C 16/45517;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

CN 103633258 A 3/2014
CN 105316623 A 2/2016
(Continued)

OTHER PUBLICATIONS

Baldo et al. "Highly efficient phosphorescent emission from organic electroluminescent devices", Nature, vol. 395, pp. 151-154, 1998.
(Continued)

*Primary Examiner* — Matthew J Song
(74) *Attorney, Agent, or Firm* — Butzel Long

(57) ABSTRACT

A deposition nozzle is provided that includes offset deposition apertures disposed between exhaust apertures on either side of the deposition apertures. The provided nozzle arrangements allow for deposition of material with a deposition profile suitable for use in devices such as OLEDs.

7 Claims, 15 Drawing Sheets

Related U.S. Application Data

(60) Provisional application No. 62/409,404, filed on Oct. 18, 2016, provisional application No. 62/320,981, filed on Apr. 11, 2016.

(51) Int. Cl.
 *C23C 16/455* (2006.01)
 *C23C 16/54* (2006.01)
 *H10K 71/13* (2023.01)
 *H10K 85/30* (2023.01)

(52) U.S. Cl.
 CPC .. *C23C 16/45525* (2013.01); *C23C 16/45563* (2013.01); *C23C 16/45565* (2013.01); *C23C 16/45574* (2013.01); *C23C 16/45578* (2013.01); *C23C 16/545* (2013.01); *H10K 71/135* (2023.02); *H10K 85/342* (2023.02)

(58) Field of Classification Search
 CPC ........ C23C 16/45525; C23C 16/45574; C23C 16/45578
 See application file for complete search history.

(56) References Cited

U.S. PATENT DOCUMENTS

| | | | |
|---|---|---|---|
| 5,367,326 A * | 11/1994 | Pond | B41J 2/16508 347/22 |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,142,615 A * | 11/2000 | Qiu | H10N 30/853 347/70 |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 9,583,707 B2 | 2/2017 | Quinn | |
| 2003/0230980 A1 | 12/2003 | Forrest | |
| 2004/0174116 A1 | 9/2004 | Lu | |
| 2008/0152806 A1* | 6/2008 | Forrest | C23C 16/4412 118/715 |
| 2008/0260963 A1 | 10/2008 | Yoon | |
| 2009/0130858 A1* | 5/2009 | Levy | C23C 16/45525 118/728 |
| 2009/0159432 A1 | 6/2009 | Kawano | |
| 2011/0059259 A1 | 3/2011 | Burrows | |
| 2013/0143415 A1 | 6/2013 | Yudovsky | |
| 2014/0057390 A1 | 2/2014 | Mohan | |
| 2015/0091982 A1* | 4/2015 | Stolk | B41J 2/1433 347/47 |
| 2015/0376787 A1 | 12/2015 | McGraw | |

FOREIGN PATENT DOCUMENTS

| | | |
|---|---|---|
| KR | 20070012846 A | 1/2007 |
| KR | 20090101918 A | 9/2009 |
| KR | 20150012583 A | 2/2015 |
| WO | 2008057394 A1 | 5/2008 |
| WO | 2010011390 A2 | 1/2010 |
| WO | 2014197396 A1 | 12/2014 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

D.F. Fairbanks et al., "Diffusion Coefficients in Multicomponent Gas Mixtures", Indust. Chem. Eng., v42, n3, p. 471-75 (Mar. 1950).

H. Yamamoto et al., "Identification of device degradation positions in multi-layered phosphorescent organic light emitting devicdes using water probes", Appl. Phys. Lett. 100, 183306 (2012), doi: 10.1063/1.4711129 (2012), 5 pages.

Chinese Office Action (with English language translation) for Application No. CN201710234006.9, dated Sep. 4, 2019, 20 pages.

Korean Office Action (with English language translation) for App. No. KR10-2017-0046757, dated Aug. 25, 2020, 12 pages.

Korean Office Action (including English translation) issued in App. No. KR20230049353, dated Jan. 10, 2024, 5 pages.

* cited by examiner

Composition summed Gaussian sprays for uniformity

Region 1 (Positive Skew)

Region 2 (Negative Skew)

NOZZLE EXIT CONTOURS FOR PATTERN COMPOSITION

CROSS-REFERENCE TO RELATED APPLICATIONS

This application is a non-provisional of, and claims the priority benefit of U.S. Patent Application Ser. Nos. 62/320,981, filed Apr. 11, 2016, and 62/409,404, filed Oct. 18, 2016, the entire contents of each of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to arrangements for depositing material such as via one or more nozzles, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

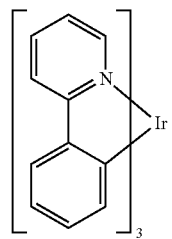

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

As used herein, "a direction of relative movement" or, more generally, "parallel" to a direction, refers to a direction approximately parallel to a direction of relative movement of a substrate and a deposition apparatus when the apparatus is used to deposit material on the substrate while the substrate and apparatus are moved relative to one another, within the tolerance required by the material being deposited or a device being fabricated. Thus, an aperture or other feature of a deposition device may be described as being arranged in or parallel to a direction of relative movement when the major axis, longest edge, etc. of the feature is parallel to the direction of relative movement within the required tolerance, even though the two may not be exactly parallel. For example, when depositing a stripe of emissive material for use in an OLED, it may be required that there be no more than 5 μm deviation in the stripe placement or deposition accuracy over the surface of the substrate, in which case a deposition aperture may be arranged parallel to the relative direction of movement with sufficient accuracy to achieve the required deviation or less, i.e., parallel to the direction of relative movement. Similarly, a feature may be parallel or perpendicular to a direction or other feature when it is as close to perfectly parallel or perpendicular as fabrication tolerances allow, and/or within any required design or fabrication tolerance for the system.

SUMMARY OF THE INVENTION

According to an embodiment, a device for deposition of a material onto a substrate, such as a print head or a deposition that includes a print head is provided, which includes a deposition nozzle having a first exhaust aperture, a second exhaust aperture, a first deposition aperture disposed between the first exhaust aperture and the second exhaust aperture and closer to the first exhaust aperture than the second aperture, and a second deposition aperture disposed between the first exhaust aperture and the second exhaust aperture and closer to the second exhaust aperture than the first exhaust aperture, wherein the second deposition aperture is offset from the first deposition aperture along an axis of the nozzle.

The first deposition aperture and the second deposition aperture may have the same dimensions, and each may be arranged such that a longest edge of each deposition aperture is along a direction of relative movement of the device and the substrate when the device is in operation. The apertures may be rectangular or any other suitable shape. The exhaust apertures may be continuous and/or rectangular, and may be arranged such that the longest edge of each is along a direction of relative movement of the device and the substrate when the device is in operation. The apertures may be arranged in various relative positions. For example, they may be arranged such that for any line drawn between and perpendicular to the first exhaust aperture and the second exhaust aperture, the line crosses no more than one of the first deposition aperture or the second deposition aperture. Alternatively or in addition, the exhaust apertures may extend ahead of and behind each of the first deposition aperture and the second deposition aperture in the direction of relative movement of the device and the substrate when the device is in operation. The may include a source of the material to be deposited on the substrate, in fluid communication with the first deposition aperture and the second deposition aperture. The device may include an external vacuum source in fluid communication with one or more of the exhaust apertures. The device may include source of confinement gas in fluid communication with one or more of the exhaust apertures. The exhaust apertures may each have a constant width along a direction of relative motion of the substrate and the device.

In an embodiment, a device is provided that includes an OLED. The OLED may include a first electrode disposed over a substrate, a first emissive layer disposed over the first electrode, and a second electrode disposed over the emissive layer. The first emissive layer may be fabricated using no more than one pass of a deposition device comprising a nozzle in fluid communication with a source of material to be deposited over the substrate in not more than 1.0 s between the initiation and conclusion of deposition on each point on the printed surface of the substrate. The device may be, for example, a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a virtual reality display, an augmented reality display, a 3-D display, a vehicle, a large area wall, a theater or stadium screen, a sign, or a combination thereof.

In an embodiment, a method of fabricating a deposition device is provided that includes dicing a wafer pair to form micronozzle array channels comprising a plurality of deposition apertures along the edges of each wafer, each aperture being defined by the intersection of a channel and a dicing line; and bonding the wafer pair to form a deposition nozzle. The deposition nozzle may include a first exhaust aperture, a second exhaust aperture, a first deposition aperture disposed between the first exhaust aperture and the second exhaust aperture and closer to the first exhaust aperture than the second aperture, and a second deposition aperture disposed between the first exhaust aperture and the second exhaust aperture and closer to the second exhaust aperture than the first exhaust aperture, where the second deposition aperture is offset from the first deposition aperture along an axis of the nozzle.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
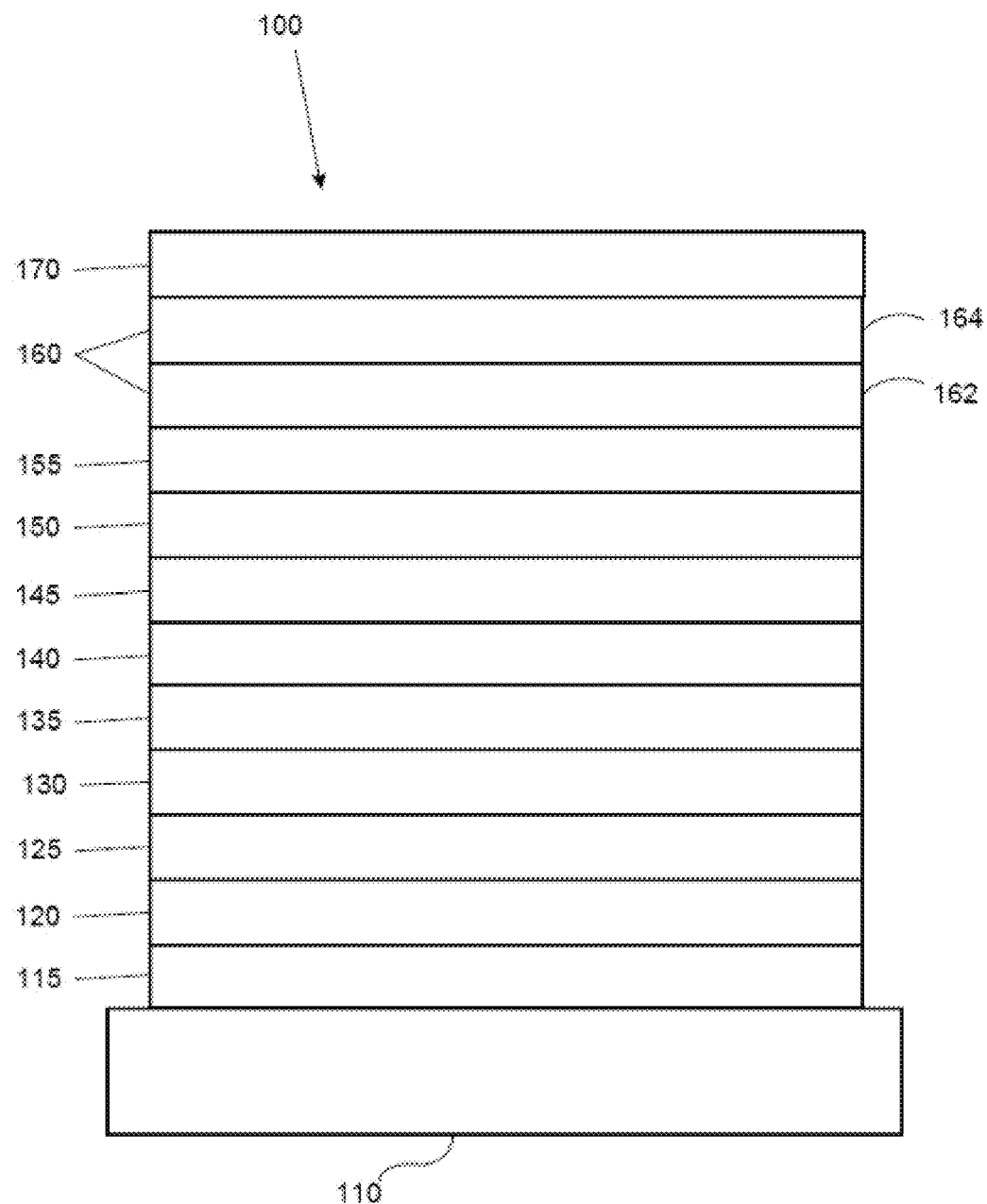
FIG. 1 shows an organic light emitting device such as may be fabricated according to techniques and devices disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
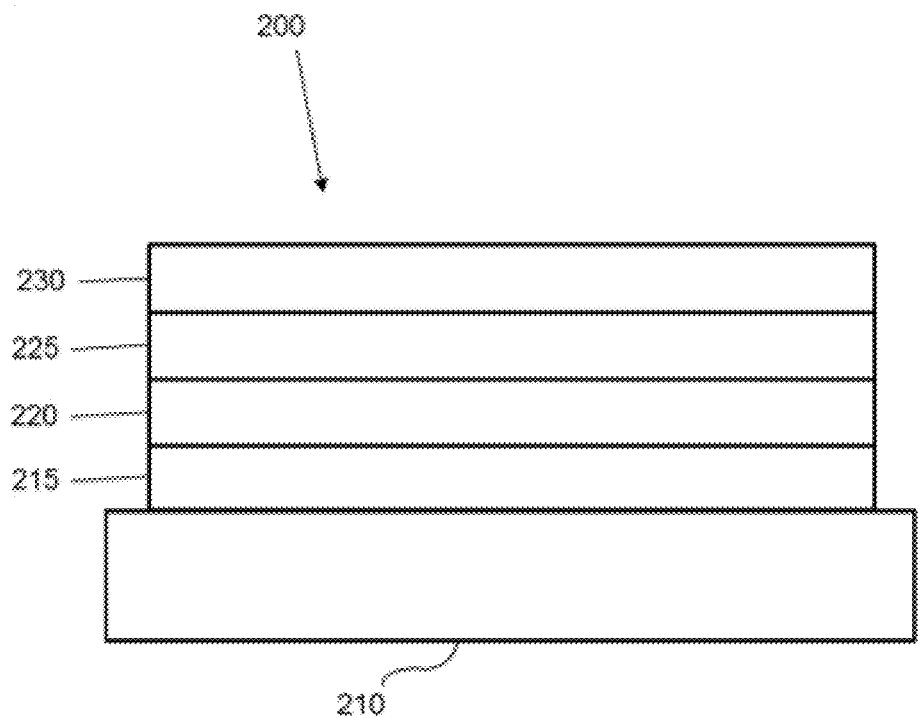
FIG. 2 shows an inverted organic light emitting device that does not have a separate electron transport layer such as may be fabricated according to techniques and devices disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, virtual reality displays, augmented reality displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

As previously described, OVJP printing techniques typically use a vapor flow of a bulk carrier gas with evaporated molecules, which is sprayed on a substrate through a nozzle. The molecules sublimate on the substrate when the gas mixture hits the surface. Material typically is deposited from a round or rectangular nozzle with a width (x-direction) and length (y-direction). A line is sprayed by moving the nozzle relative to the substrate in the y-direction. The Gaussian thickness profile of a thin film features printed by OVJP may not be ideal for OLED printing applications because OLEDs typically require uniform thickness over their active area. Thickness uniformity is currently obtained by printing features in multiple offset passes. This disclosure describes a depositor with a split delivery aperture that provides a more desirable deposition profile and allows for printing features with more uniform thickness. This depositor geometry is expected to reduce TAKT time because it allows an OLED array to be printed in fewer passes. It is furthermore expected to reduce contaminant exposure and improve the operational lifetime of printed OLEDs since it minimizes the period between the initiation and completion of EML deposition for each OLED in an array. This depositor geometry can be readily made using techniques already used to fabricate DEC (delivery-exhaust-confinement) OVJP micronozzle arrays, such as those described in U.S. Pat. No. 9,583,707, the disclosure of which is incorporated by reference in its entirety.

Figure 3:
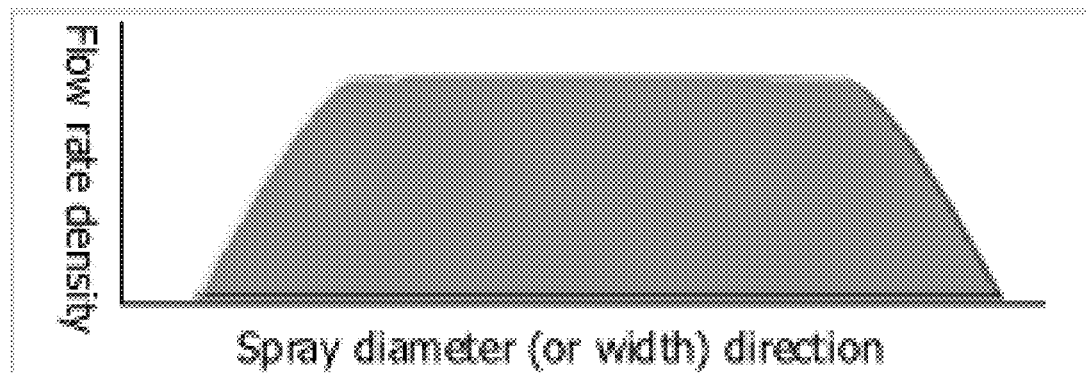
FIG. 3 shows a general deposition profile achievable according to embodiments disclosed herein.
Figure 4:
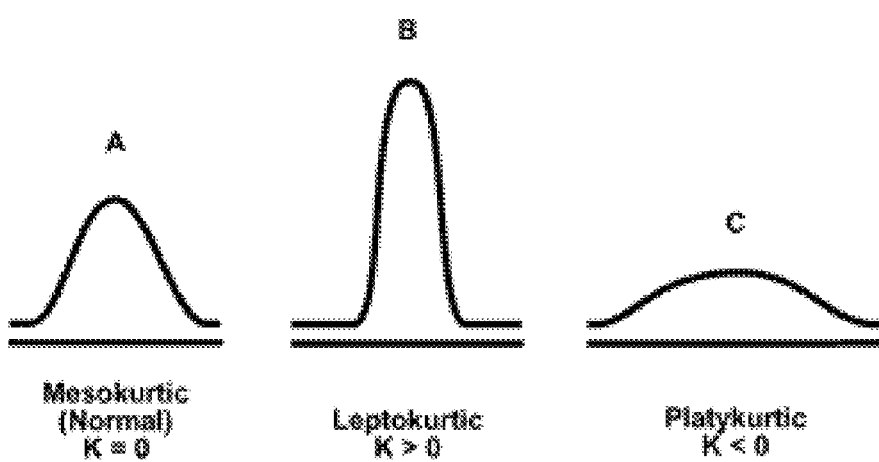
FIG. 4 shows examples of deposition profiles and associated distribution types as disclosed herein.

For example, in many applications it may be preferred to create deposition profiles that are trapezoidal in shape, such as with a uniform top side and steep skewed chamfers as shown in FIG. 3. However, techniques to do so using conventional OVJP arrangements are limited. The deposition profile that results from use of a particular nozzle can be described by the statistical distribution type and parameters, where the kurtosis of the distribution describes the resulting shape. The deposition profile in x-direction from a round or rectangular nozzle shape generally will have a typical Gaussian shaped distribution that broadens with an increasing distance from nozzle to substrate. Examples of such deposition profiles and associated distribution types are shown in FIG. 4. A high kurtosis or leptokurtic distribution gives strong skewness of the sides and a high peak in the center. A negative kurtosis gives low skewness and can result in a platykurtic profile that shows a plateau in the center.

To deposit a pattern that approaches a trapezoid shape with 90% uniformity over a certain width, it is possible to stitch individual Gaussian patterns at the 50% or FWHM (Full Width Half Maximum) level. The total width is then the spray uniformity width and the sum of both chamfers or tails. In some applications where OVJP is used to deposit sub-pixel lines, such as fabrication of displays, it may be desirable for the spray uniformity width to be at least the width of the sub-pixel active area. Further, it generally is preferred or necessary for the total width of a deposited line to be less than the distance between the two neighboring sub-pixel lines to prevent different colors of emissive materials from mixing during fabrication. In many cases the uniform part of the pattern in the central plateau is a primary deposition goal, with the sides of the profile preferably being sufficiently constrained so as to avoid contamination of neighboring areas. Preferably, the sides of the final deposition are vertical or approximately vertical, or with a side angle as steep as possible.

Figure 5:
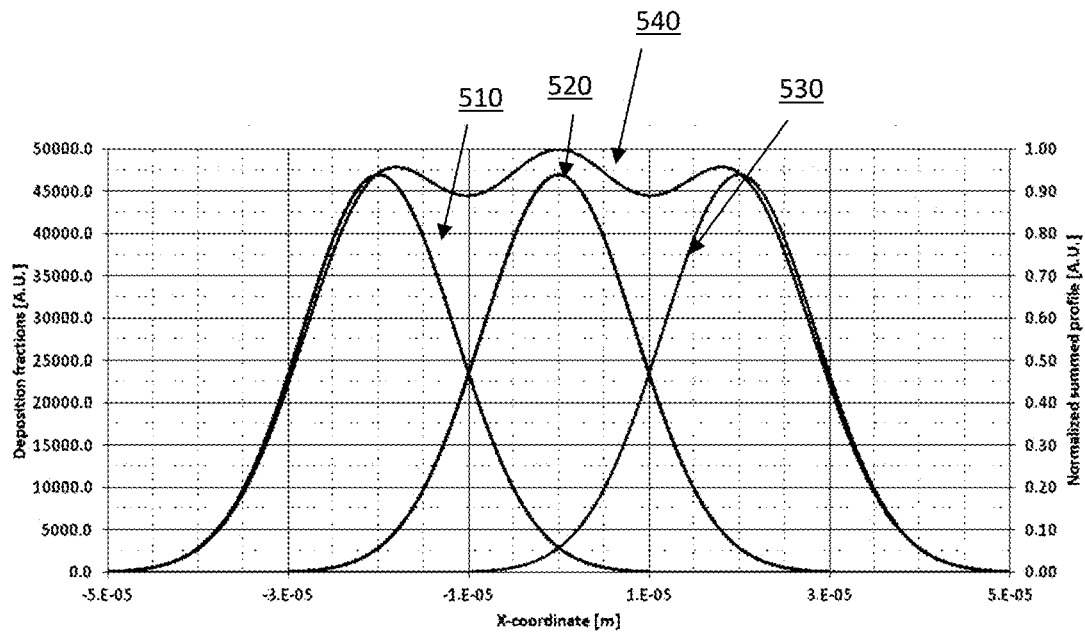
FIG. 5 shows an example of a deposition pattern having a central width with high uniformity according to an embodiment disclosed herein.

FIG. 5 shows an example of such a pattern, having a central width with high uniformity. The total resulting deposition pattern 540 may be achieved by deposition of two or more shifted Gaussian profiles 510, 520, 530, for example, resulting from two or more nozzle passes or two or more sequential shifted nozzles. More generally, any number of nozzles and/or passes of one or more nozzles may be used to fabricate or approximate a desired deposition profile.

Figure 6:
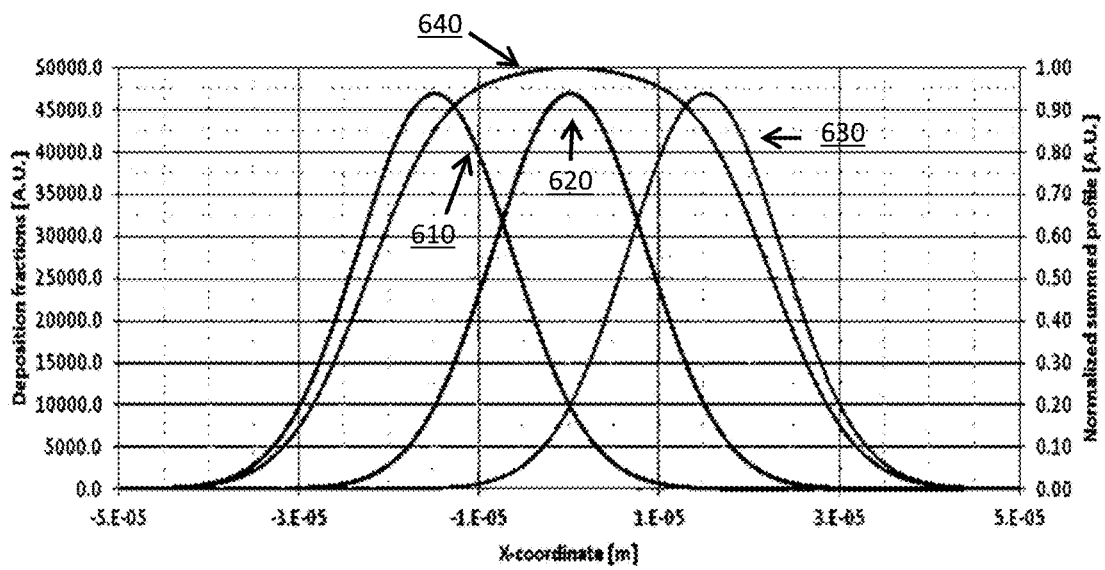
FIG. 6 shows an example of a deposition profile formed from three depositions.

When the shift in x-direction of two neighboring deposition patterns from two nozzles having the same shift is less than the FWHM of the deposition profile, the combined pattern will be a Gaussian profile which is wider and higher than the individual patterns. FIG. 6 shows an example of such a profile 640 formed from three depositions 610, 620, 630.

When the shift of two depositions is greater than the FWHM of the individual deposition profile, the combined profile will result in either a platycurtic profile or (with a larger shift) in a profile with two neighboring peeks. A shift that is only slightly larger than approximately the FWHM results in a deposition profile with a middle section having have a width that satisfies the 90% uniformity demand. The width of this plateau is wider than the narrow plateau in a single profile by the amount of the shift. Adding more profiles, such as by making additional passes with one or more nozzles, each shifted with respect to the neighboring profile in the same fashion, will similarly widen the area with 90% uniformity.

To meet the conventional desired trapezoid shape, the width of the base should not be so wide that it covers the neighboring sub pixel active areas. However, the base width increases proportional to the added width from the shifted patterns. One approach to limit the base width while achieving a desired width with 90% uniformity is to add more depositions with higher kurtosis profiles, i.e. adding more profiles that are narrower. This can result in a combined profile with the same area of 90% uniformity, but with steeper side walls to the profile, resulting in a narrower base of the combined profile. Such techniques require a combination of more and narrower profiles, and have several drawbacks. For example, narrower profiles require a shorter distance between the nozzle and the substrate and/or narrower nozzles to achieve the desired profile shape. As another example, combining narrower profiles require more accurate positioning of one profile with respect to another, requiring greater precision in control of the deposition apparatus. More generally, combining more patterns from a single nozzle requires increased processing time, whereas generating a combined profile from more nozzles increases the number of nozzles in operation at any one time and thus the complexity and cost of the deposition system.

Accordingly, a preferred solution to achieve desired deposition profiles is a single nozzle arrangement that deposits all the components of the desired composite profile in a single pass, without the need for multiple narrow nozzle apertures. Embodiments of such an arrangement are provided herein, which include a series of deposition nozzle shapes that generate a cumulative deposition profile of a substantial trapezoid shape as they move in the y-direction.

Figure 7:
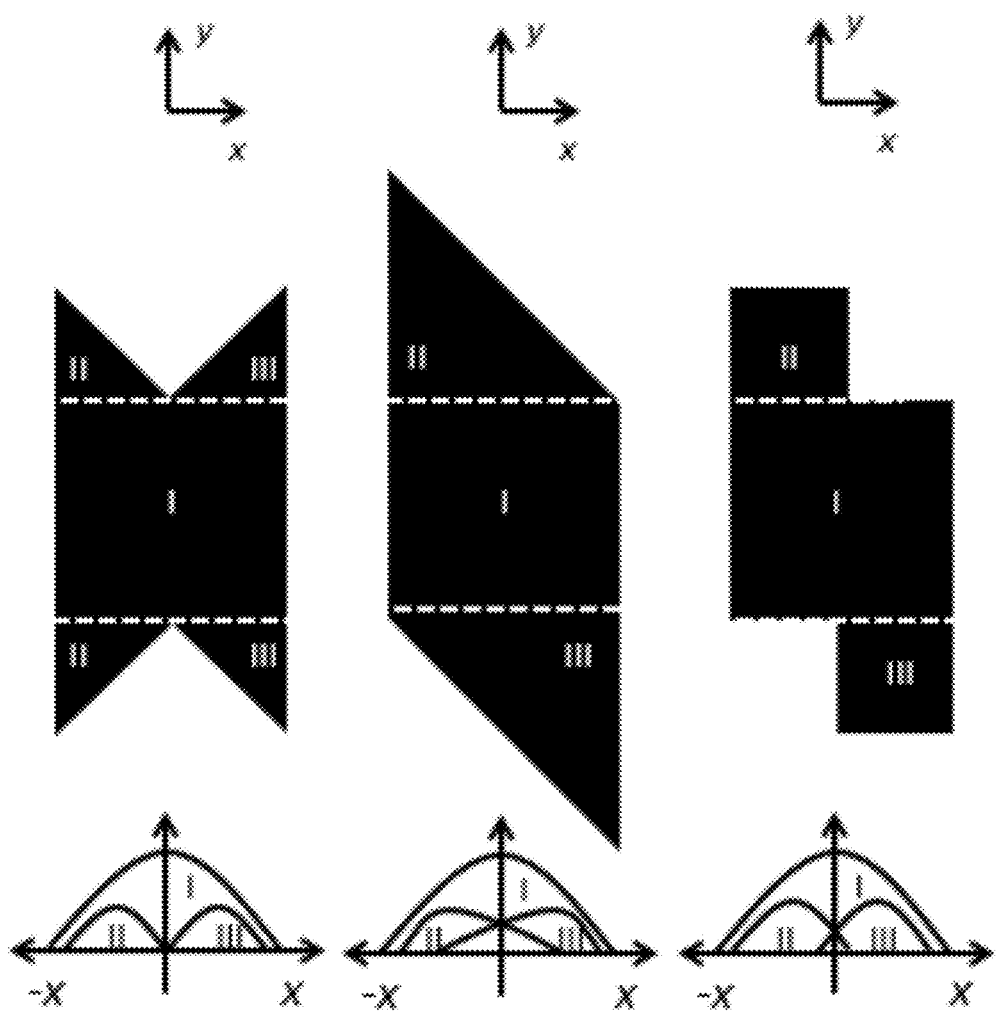
FIG. 7 shows example nozzle aperture arrangements according to embodiments disclosed herein.

FIG. 7 shows example nozzle aperture arrangements according to embodiments disclosed herein. The shapes are shown as viewed from above or below the deposition apparatus, e.g., viewed from the substrate in a direction away from the surface on which material is to be deposited, toward the deposition apparatus. The shapes of the single nozzle aperture in these embodiments have areas that contribute to the overall deposition pattern from the nozzle in essentially discrete sections. In each example, a central area I results in a central profile I indicated in the deposition graph below. Similarly, the other nozzle aperture areas II and III result in smaller deposition profiles shifted from the center profile I as shown in the corresponding deposition profiles shown below. As previously described, in each example the y-axis indicates the relative direction of movement of the substrate on which material is deposited and the deposition system.

The nozzle shapes are designed in such a way that each central section I provides a wide Gaussian shape with low kurtosis. That is, if the nozzle aperture included only the central section I, the resulting deposition profile would be Gaussian with low kurtosis. At the outer sides, the deposition profiles result from relatively narrower nozzle sections to deposit a profile portion with higher kurtosis. As discussed above, the superposition of these contributions may provide a shape that is or approaches a trapezoid. Specifically, the resulting shape may include a relatively flat mesa region in the middle, and relatively sharp vertical walls on either side.

Figures 8A, 8B, 8C:
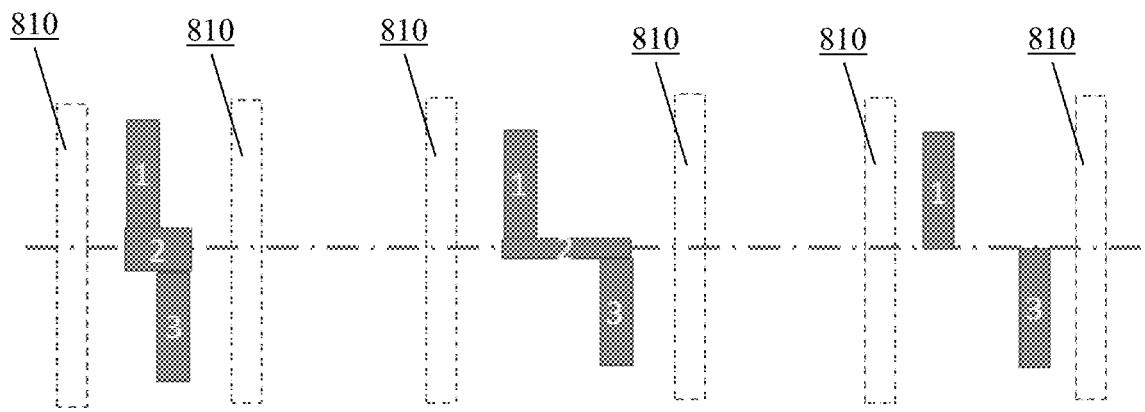
FIGS. 8A, 8B, and 8C show example nozzle aperture arrangements according to embodiments disclosed herein.

Other variations on the nozzle aperture shapes shown in FIG. 7 may be used. For example, FIGS. 8A-8C show variations on the third arrangement shown in FIG. 7. In some arrangements, such as FIGS. 8A and 8B, the deposition nozzle may include a single continuous aperture with different regions. In other arrangements, the deposition nozzle may include multiple distinct regions such as shown in FIG. 8C. Regardless of whether one or several apertures are present, each of the areas 1, 2 and 3 may all contribute to the combined deposition profile as previously disclosed.

Figure 9:
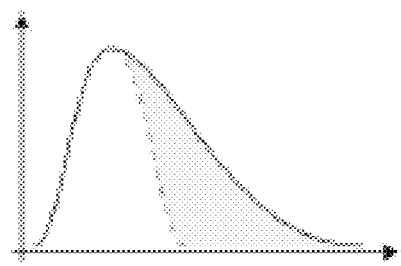
FIGS. 9 and 10 show example deposition profiles resulting from different sections of the nozzle aperture arrangements disclosed herein.
Figure 10:
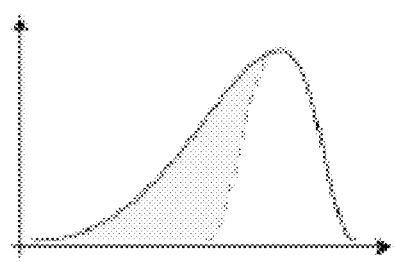

In some embodiments, exhaust channels or apertures may be provided on either side of the deposition nozzle. For example, the arrangements shown in FIGS. 8A-8C include exhaust channels 810 arranged on either side (along the x-axis) of the deposition aperture. In the examples shown the exhaust channels are provided as a single rectangular aperture on either side of the combined deposition apertures, though more generally any arrangement of one or multiple exhaust channels may be used. Each exhaust channel may be in fluid communication with a low-pressure region, vacuum source, or the like, so as to remove undeposited material from the region or regions between the substrate and the deposition apparatus. The exhaust channels also may provide regions of different pressure or active confinement flows on either side of the deposition nozzle to further confine and/or shape the resulting deposition profile as disclosed herein. Various arrangements and examples of exhaust and confinement channels are described in U.S. application Ser. No. 14/643,887, filed Mar. 10, 2015, 14/730, 768, filed Jun. 4, 2015, and 15/290,101, filed Oct. 11, 2016, the disclosure of each of which is incorporated by reference in its entirety. Generally, as disclosed in those applications, micronozzle array technology which utilizes a combination of deposition apertures surrounded by exhaust apertures and a gas confinement flow to confine the line width and overspray uses the concepts of Deposition, Exhaust, and Confinement, and accordingly may be referred to as a DEC process or device. FIG. 9 shows the separate feature profiles printed by the top and bottom depositors of FIG. 8C that sum to form the desired profile. FIG. 9 shows the left skewed deposition profile generated by section 1 and FIG. 10 shows the right skewed profile generated by section 3.

Figure 11A:
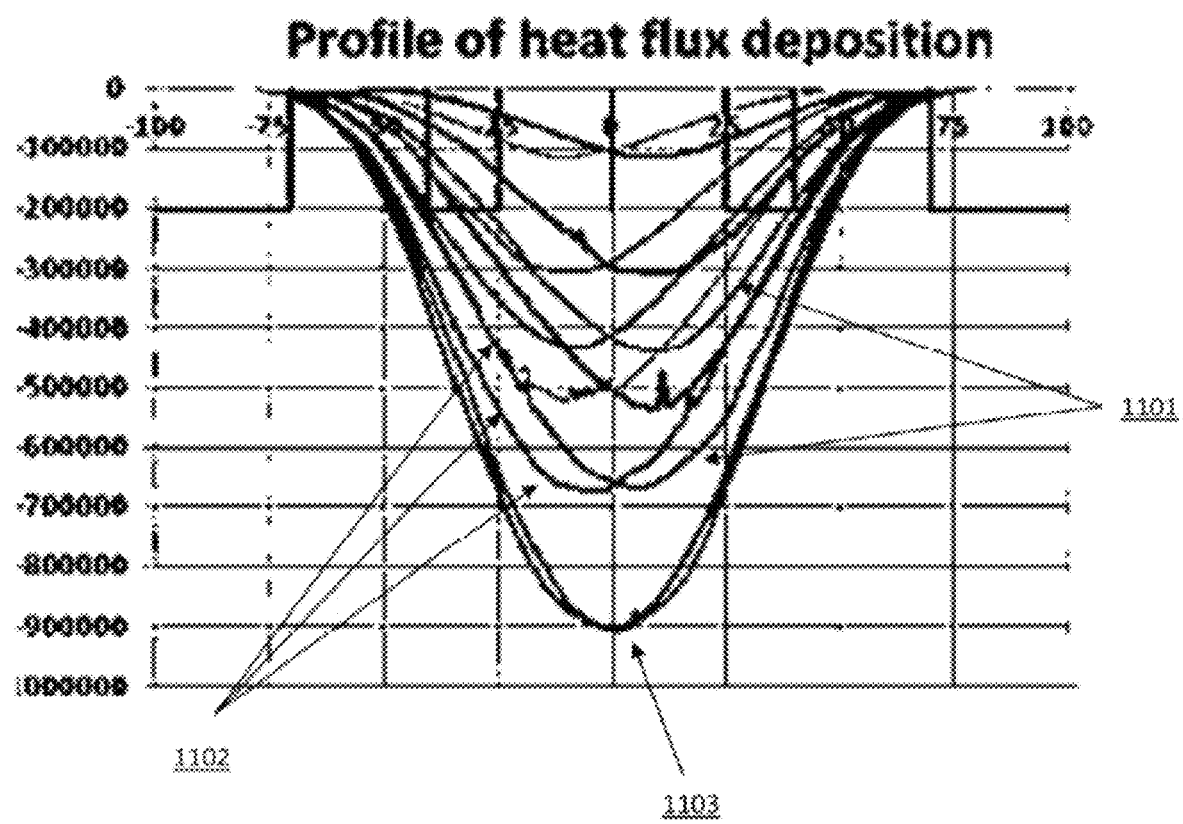
FIGS. 11A, 11B, and 11C, respectively, show the partial contributions in the x-direction at different y-sections of depositions resulting from arrangements as shown in FIGS. 8A, 8B, and 8C.
Figure 11B:
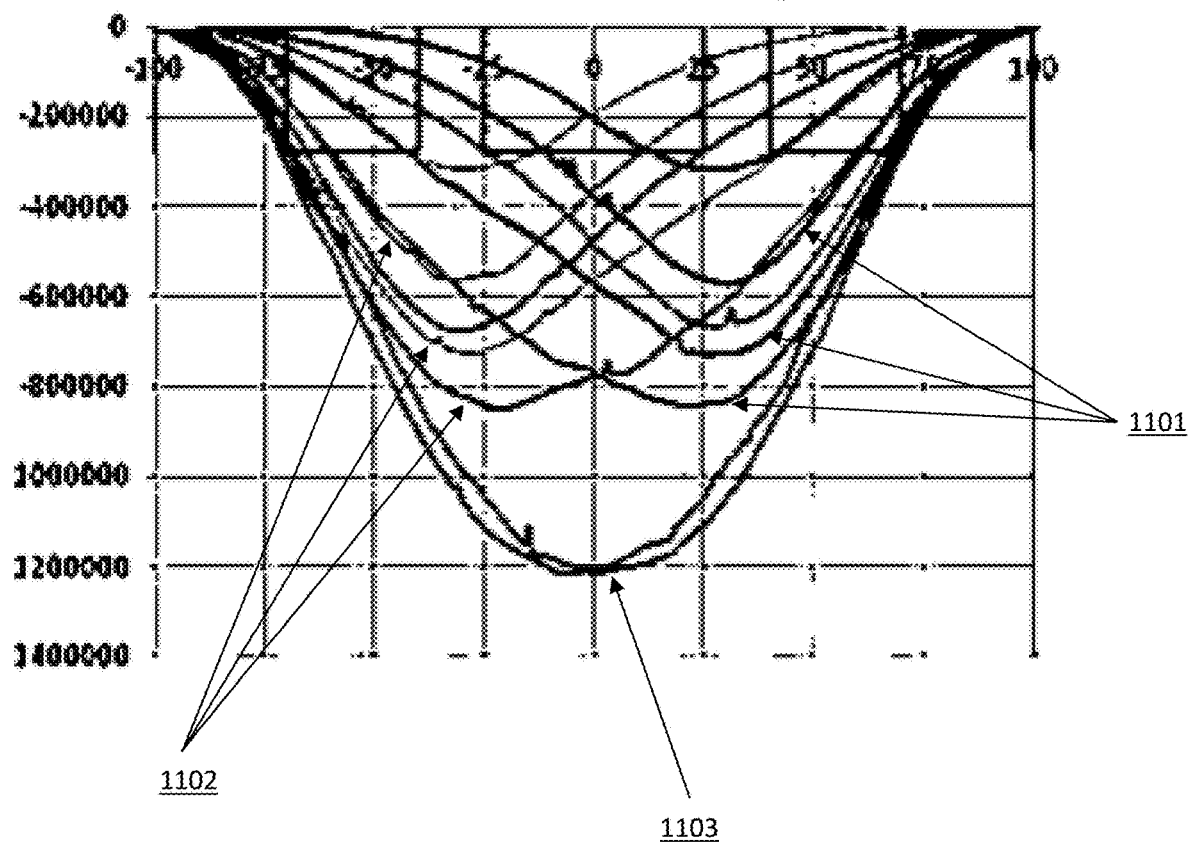
Figure 11C:
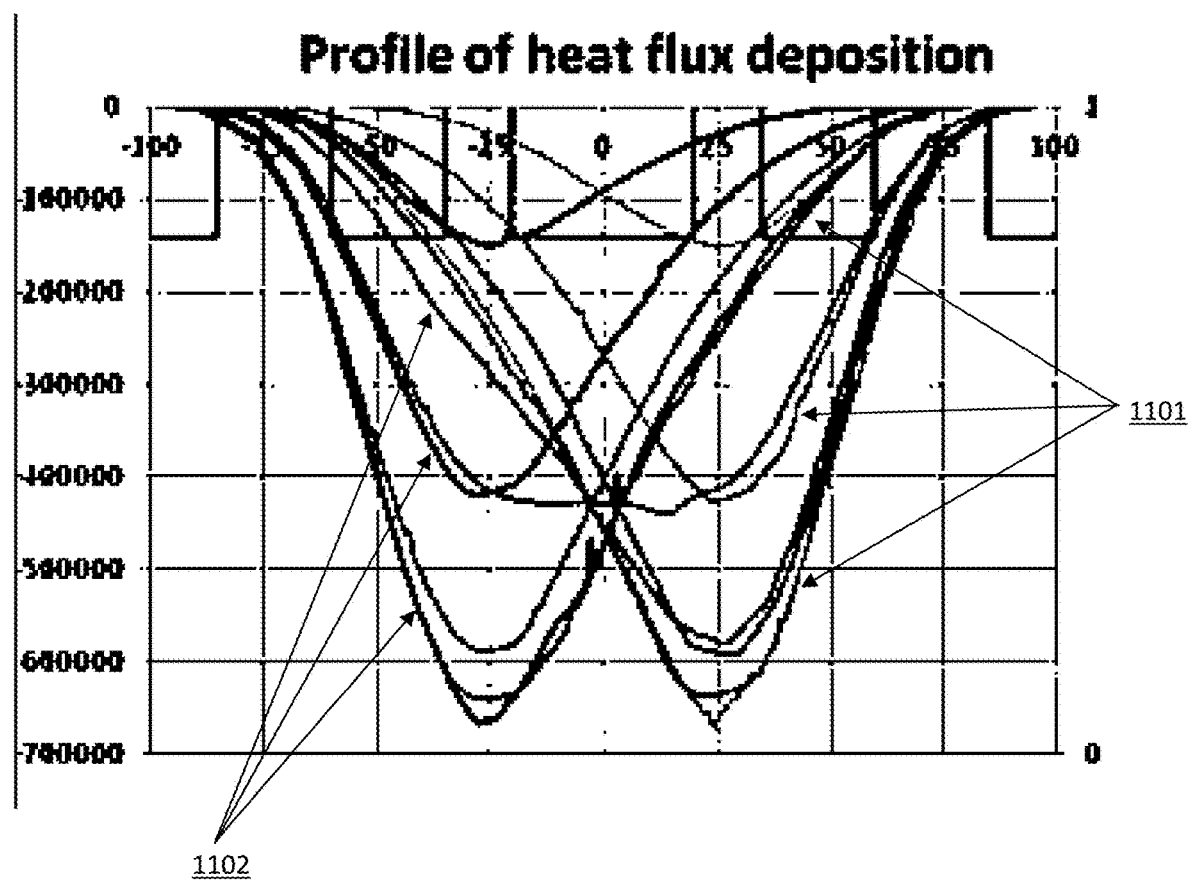
Figure 12A:
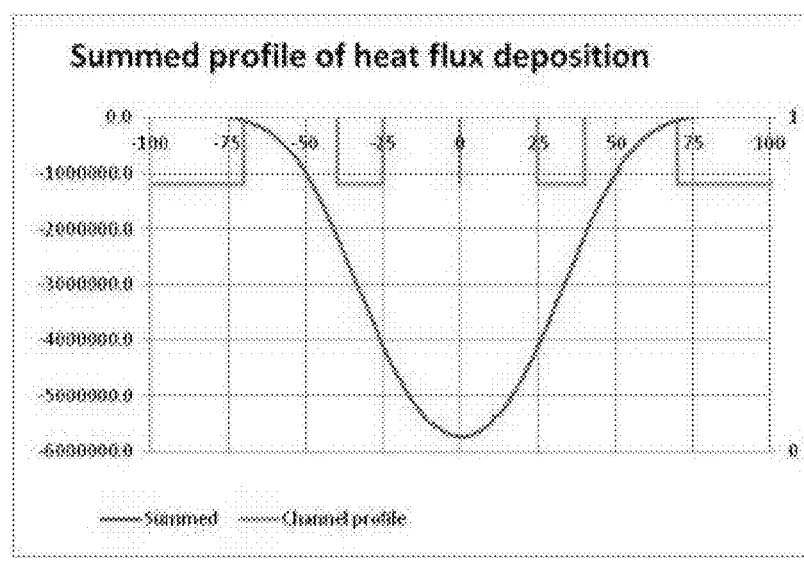
FIGS. 12A, 12B, and 12C show, respectively, the weighted sum of the profiles of depositions resulting from arrangements as shown in FIGS. 8A, 8B, and 8C.
Figure 12B:
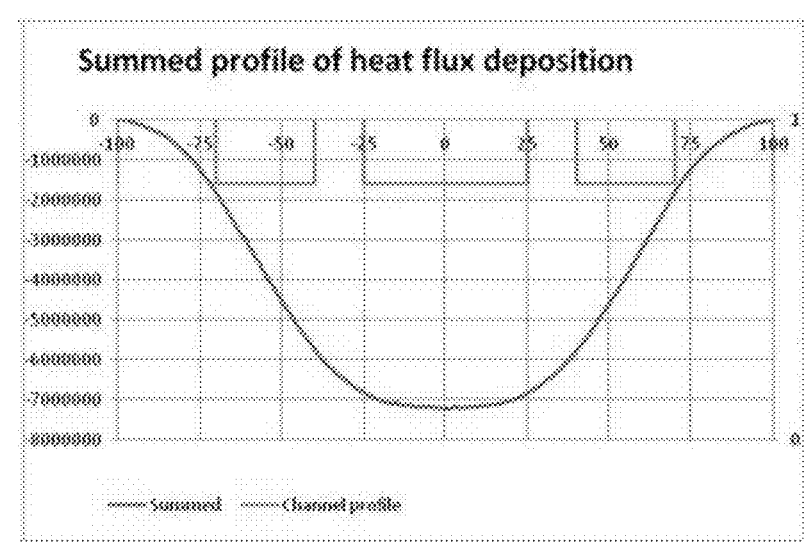
Figure 12C:
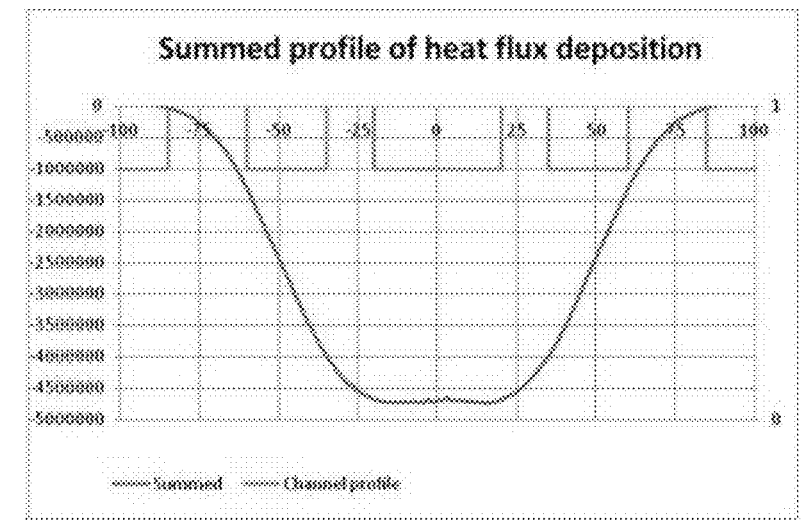

FIGS. 11A, 11B, and 11C shows the organic vapor flux generated on the substrate by the aperture sets depicted FIGS. 8A, 8B, and 8C, respectively. Each line indicates the flux profile generated at a given cross section in y, as a function of x. Deposition on substrate sections under sections 1 1101 and 3 1102 is skewed to one side, as shown in FIG. 9. Section 2 generates a region of high flux 1103 that is symmetric in the x dimension. This type of feature is generated by the configurations of FIGS. 8A and B, but not of FIG. 8C. The cross sections of organic flux are summed to generate the deposition profiles plotted in FIG. 12. Integrated flux is plotted on the vertical axis as a function of x. FIGS. 12A and B, which correspond to aperture configurations in FIGS. 8A and 8B, respectively, have maxima in the center due to the open deposition aperture at the center of each configuration. The maxima of FIG. 12C symmetric and off-center, generating a more mesa-like deposition profile, with a wider top and less kurtosis. The nozzle design depicted in FIG. 8C is therefore a preferred embodiment in this case.

Figure 13:
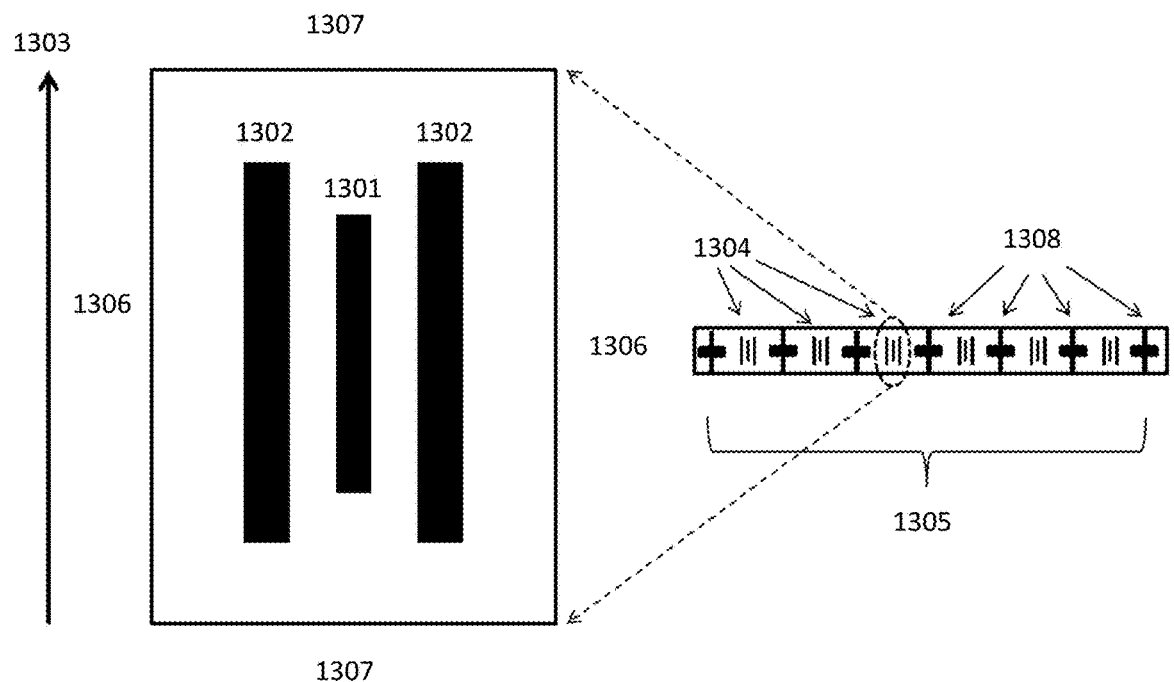
FIG. 13 shows an example depositor used in an OVJP process and a micronozzle array according to an embodiment disclosed herein.

The use of gas confinement is a departure from conventional OVJP concepts since it uses a chamber pressure of 50 to 300 Torr, rather than high vacuum. Overspray is reduced or eliminated by using a flow of confinement gas to prevent the diffusive transport of organic material away from the desired deposition region. A schematic depositor design is shown from the perspective of the substrate in FIG. 13. Such an arrangement uses rectangular delivery 1301 and exhaust apertures 1302 similar to those previously shown and described with respect to FIG. 8, which can be easily manufactured. The flow through the delivery aperture contains organic vapor entrained in an inert delivery gas. The exhaust apertures withdraw gas from the region under the depositor at a mass flow rate exceeding the delivery flow. They remove the delivery flow and any surplus organic vapor entrained within it, as well as a balance of confinement gas drawn from the ambient surrounding the depositor. Depositors of the DEC design are generally are arranged so that the long axes of their apertures are parallel to the direction of printing 1303, i.e., the y-axis as previously described. Depositors 1304 are usually arranged linearly on a micronozzle array 1305, so that each depositor borders another on at least one its side boundaries 1306. The top and bottom edges of the depositor 1307 may be defined by the edges of a linear micronozzle array that includes multiple micronozzle arrangements as shown. Distribution channels 1308 placed between depositors may provide a source of confinement gas along the sides of each depositor. Confinement gas flows inward from the edges of the micronozzle array if these channels are omitted. Arrays are typically designed to minimize crosstalk between depositors so printed features are uniform across the width of the array. Additional exhaust apertures can be placed at the ends of the array, for example, to minimize edge effects. The flow field under such a micronozzle array therefore has periodic symmetry.

The average thickness t of a printed film is given by $t=j\tau/\rho$, where j is the mass flux of organic vapor onto the substrate, $\tau$ is the period of time a given point on the substrate is under the aperture, and $\rho$ is the density of the condensed organic material. Because $\tau=l/v$, where l is the length of the aperture and v is the relative velocity of the substrate, a longer delivery aperture permits a given point on the substrate surface to remain under the aperture for a longer time at a given print speed. This permits faster printing, so longer apertures may be preferable in many applications. For example, embodiments disclosed herein may allow for fabrication of an emissive layer, such as for an OLED, in not more than 1.0 s, 0.1 s, or 0.01 s. However, delivery aperture dimensions may be subject to limitations of the fabrication process used to create the deposition device. For example, they can be about 20-30 times longer than they are wide if fabricated using deep reactive ion etching. Smaller nozzles print higher resolution features, but fabrication and operational concerns usually set the practical minimum size. As a specific example, optimal delivery apertures for printing 120 µm wide features generally will have a width of 15-20 µm. Other dimensions may be used depending upon the feature size desired.

Figure 14:
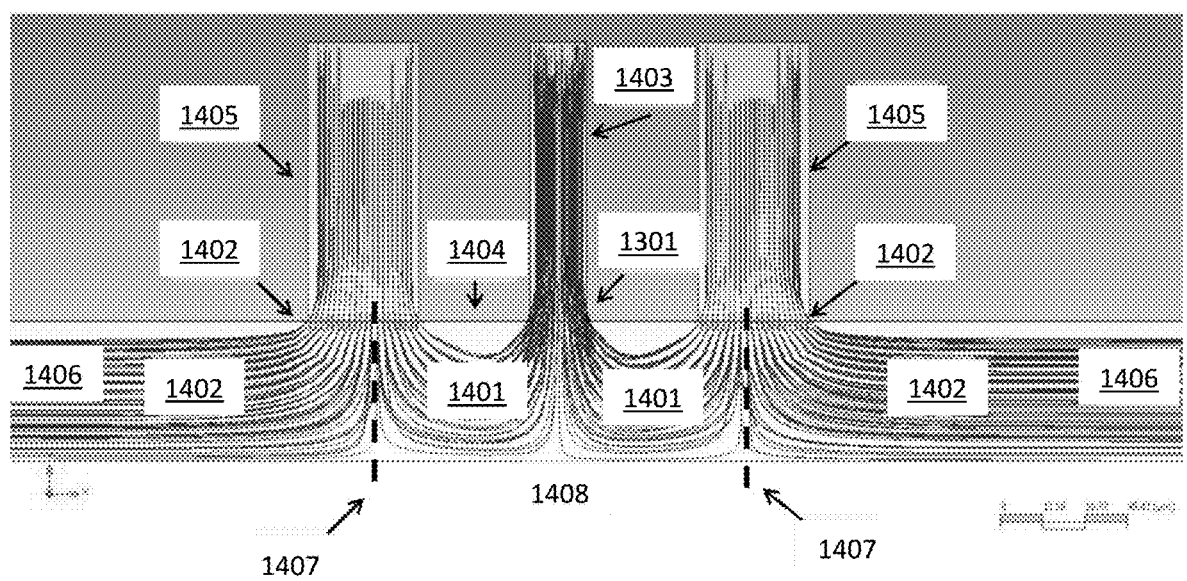
FIG. 14 shows streamlines of a process gas flow generated by a depositor as shown in FIG. 13 according to an embodiment disclosed herein.

FIG. 14 shows the arrangement of deposition and exhaust channels and the streamlines of the delivery 1401 and confinement flows 1402 in cross section normal to the direction of printing. The delivery flow passes from a delivery channel 1403, through a delivery aperture 1301, under the delivery-exhaust (DE) spacer 1404, through an exhaust aperture 1402, and finally out of the deposition zone through the exhaust channel 1405. Confinement gas flow comes from a far-field source 1406 and travels beneath the surface of the depositor before exiting through the exhaust aperture. The delivery flow is confined to the region between the exhaust channels by the confinement gas flowing into the exhaust aperture along the surface of the substrate. The surface where the two flows meet is defined as the stagnation surface 1407, where velocity in the x direction, orthogonal to both the substrate normal and the direction of line printing, $v_x=0$. The width of the region enclosed by the stagnation surface corresponds well to the width of printed features, so the position of the stagnation plane controls the shape of the deposition zone 1408.

Figure 15A:
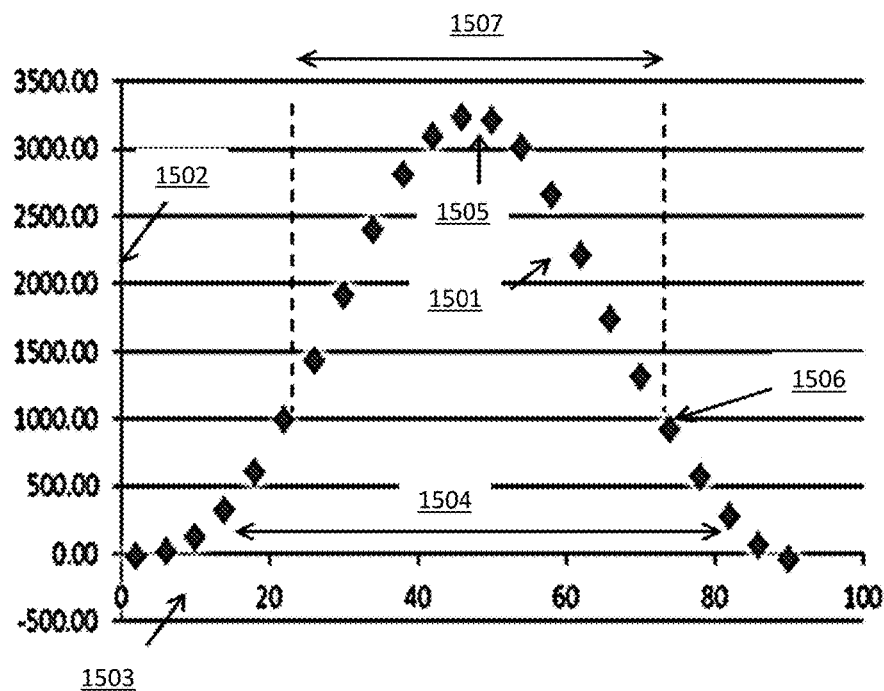
FIG. 15A shows a cross-sectional profile of the thickness of a thin film feature printed by a depositor with a single delivery aperture in one pass according to an embodiment disclosed herein.
Figure 15B:
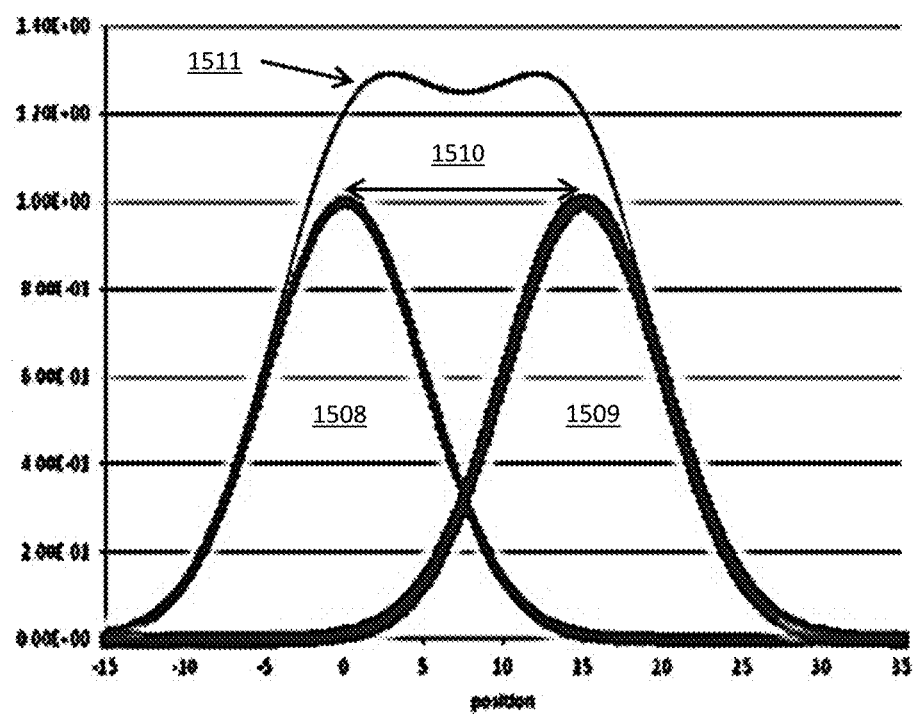
FIG. 15B shows a cross-sectional profile of the thickness of a thin film feature printed by a depositor with a single delivery aperture in two passes according to an embodiment disclosed herein.

FIGS. 15A and 15B show the cross-sectional profiles of the thicknesses of a thin film feature printed by a depositor with a single delivery aperture in one or two passes, respectively, according to an embodiment disclosed herein. The cross sectional thickness profile 1501 of a feature printed by an individual DEC depositor is approximately Gaussian, as shown in FIG. 15A. The vertical axis 1502 is film thickness in arbitrary units and the horizontal axis 1503 is displacement from the delivery aperture centerline in the x direction in microns. There are two basic criteria of interest for the shape of deposited feature—width and thickness uniformity. The width includes both the gross feature and any overspray surrounding it, since overspray can contaminate adjacent features and limit resolution. Full width to 5% of maximum (FWSM) is the width 1504 at between two points on the opposite sides of a feature cross section that are at 5% of the maximum feature thickness 1505. The total tolerable width for a printed feature is typically about 160 µm for an average high resolution display application, including regions contaminated by overspray. The uniformity refers to the difference between the maximum and minimum 1506 thickness of over a width 1507, typically 50 µm, across the center of the feature, divided by the average thickness over that width. This width corresponds to an electrode on a typical subpixel of an OLED display. It is generally required for printed OLEDs to have a uniform or nearly uniform thickness over their active width to operate properly.

As disclosed herein, adequate uniformity can be achieved by printing each feature in two passes, 1508 and 1509, with an offset of somewhat less than the pixel width between the print passes 1510. Two offset features superimpose to create a composite feature 1511 having a more mesa-like profile. As a specific example, when an offset of 40 µm is desirable for printing uniformity (such as may be common for high-resolution, full-color displays), the width of line printed by each pass should be no more than 120 µm. However, double printing increases TAKT time compared with single-pass printing and thus may be desirable to avoid in many applications.

Furthermore, printing in multiple passes creates an interval during which the emissive layer (EML) of an OLED is partially printed and, therefore, more vulnerable to environmental contamination than a completed feature. For example, it has been shown in H. Yamamoto, C. Adachi, M. S. Weaver, and J. J. Brown *Appl. Phys. Lett.* 100, 183306 (2012) that the operational lifetime of a phosphorescent OLED is significantly reduced if it is exposed to traces of water vapor between the initiation and completion of EML growth. It is much less sensitive to contamination once the EML is completed. The time between start and completion of a 300 Å thick EML is on the order of 0.1 s or less for a subpixel printed by OVJP. If only a single printing pass is required, this greatly reduces the interval in which the EML may become contaminated. In contrast, vacuum thermal evaporation (VTE) typically requires one or more minutes to deposit an EML, suggesting that a single print pass OVJP may be capable of depositing even higher purity films than VTE.

Figure 16A:
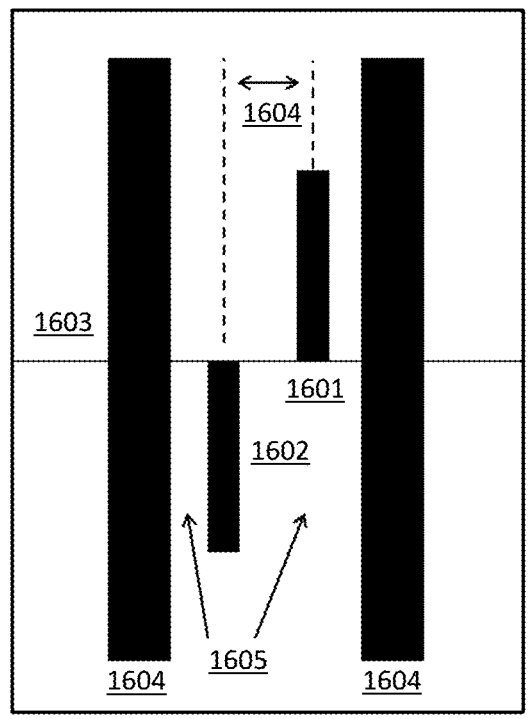
FIG. 16A shows a depositor with a split and offset delivery aperture and the thickness profiles of features printed by the upper half of the depositor for various exhaust flow rates and aperture offsets according to an embodiment disclosed herein.
Figure 16B:
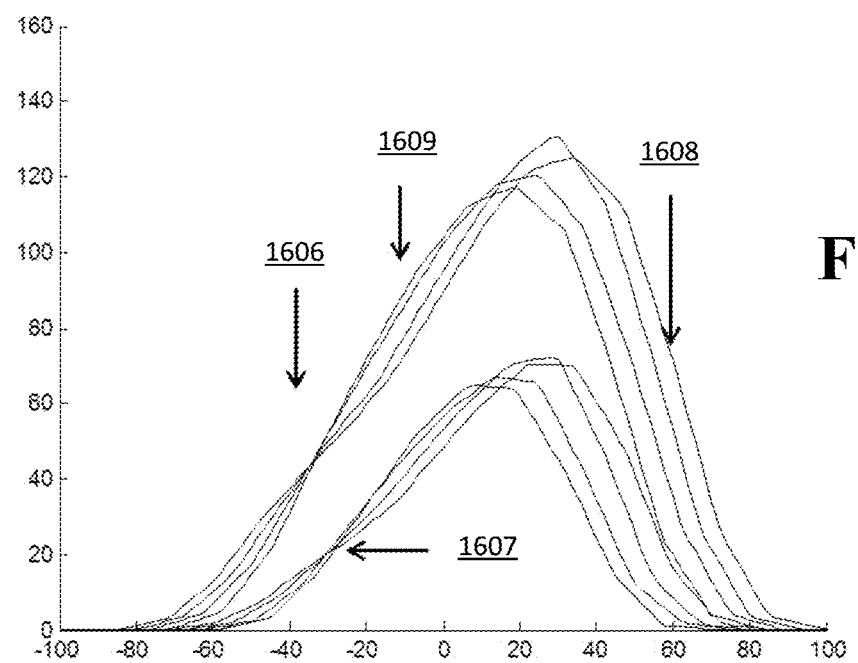
FIG. 16B shows deposition profiles resulting from asymmetry of DE spacers according to an embodiment disclosed herein.
Figure 17A:
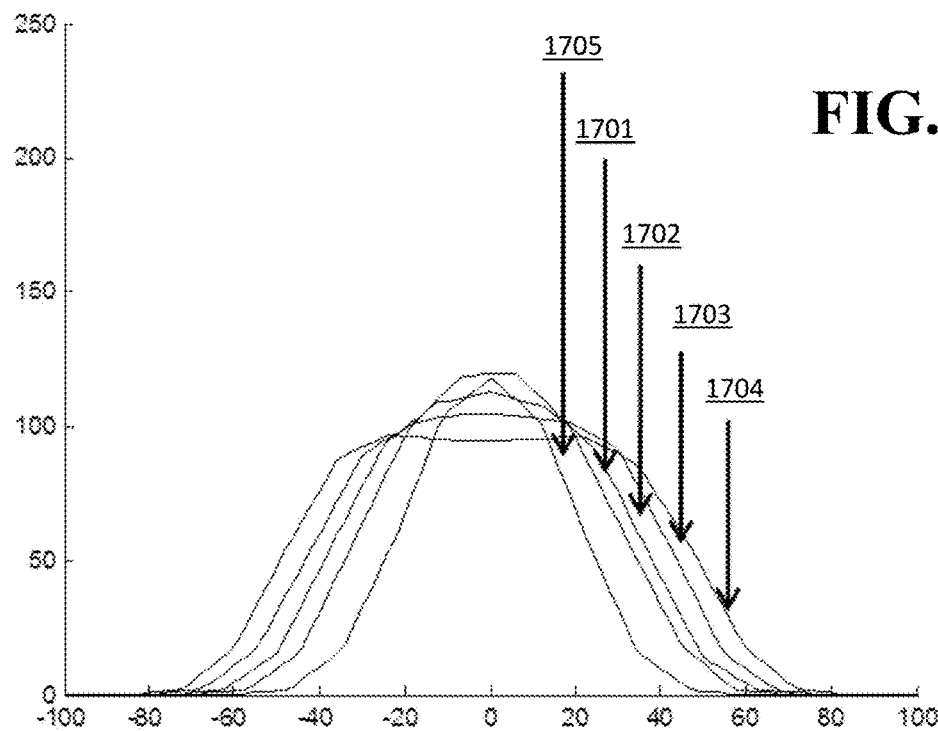
FIG. 17A and FIG. 17B show cross-sectional thickness profiles of features printed by a depositor with a split delivery aperture for exhaust flow rates of 9 sccm and 18 sccm, respectively, and aperture offsets according to an embodiment disclosed herein.
Figure 17B:
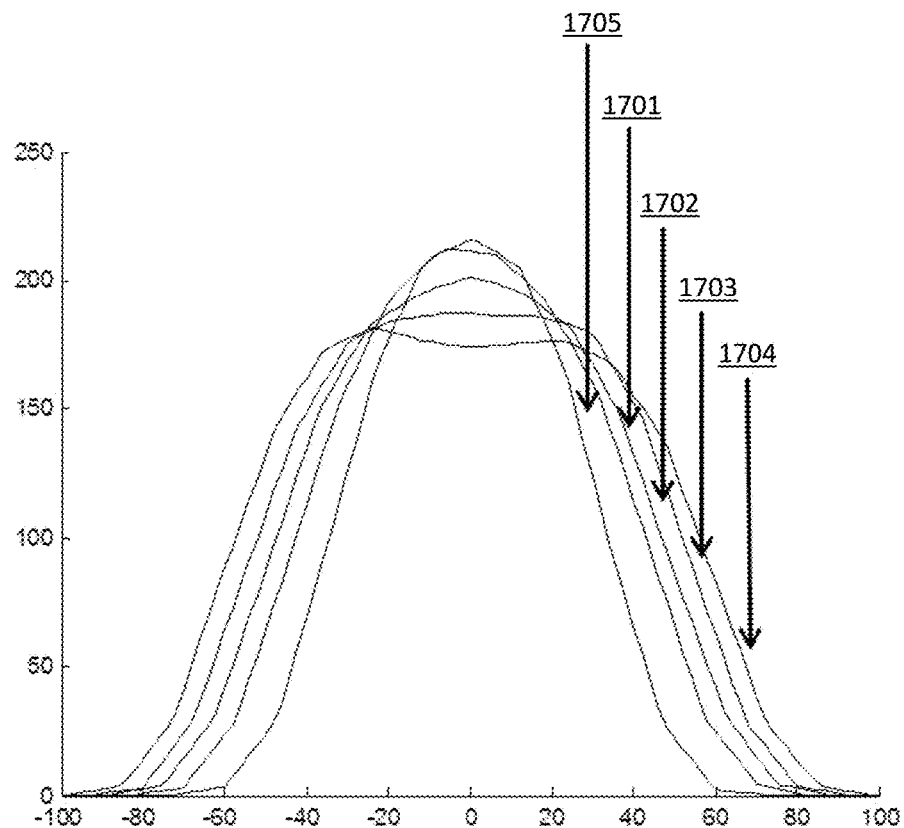
Figure 18:
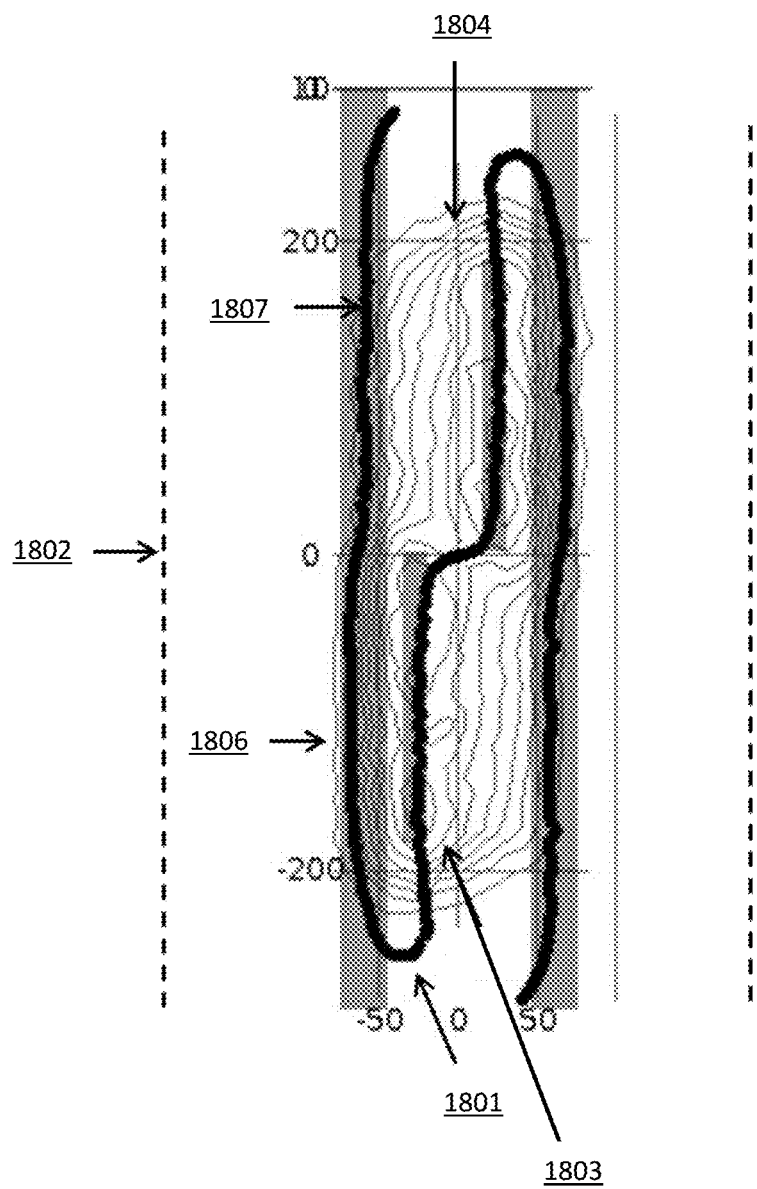
FIG. 18 shows a contour plot of organic vapor flux from a split depositor to the substrate according to an embodiment disclosed herein in which the depositor apertures are overlaid, as is the contour of the stagnation plane separating various regions of process gas flow.

According to embodiments disclosed herein, the effect of two-pass printing can be achieved in a single pass using depositor with a delivery aperture split into two sections that are offset by approximately the distance between two print passes by a depositor with a single delivery aperture. FIG. 16A shows the split nozzle design and FIG. 16B shows a resulting deposition profile. The delivery aperture is split into upper 1601 and lower apertures 1602 along its midline 1603. The exhaust apertures, however, may remain straight and continuous. The upper and lower delivery apertures may be discontinuous and the center of each aperture is separated by an offset distance 1604 that can be optimized for a desired feature size and uniformity. A 40 µm offset works well for display printing applications. The DE spacers 1605 on each side of an aperture are asymmetric, differing in width by the offset. The forward and rear components of the depositor act almost independently, so the change in the thickness profile of the printed feature is a largely geometric effect.

In such a configuration, the exhaust aperture withdraws organic vapor more aggressively on the side of the narrower DE spacer. This results in a sharp sidewall 1608 that defines the outer edge of the aggregate feature. The material deposited on the side of the wider DE spacer 1609 does not define as steep an edge, since its thickness tapers more gradually. Less organic vapor is removed by the exhaust on the side of the wide spacer, so material utilization efficiency improves with greater offset width. Feature profiles become both wider and more asymmetric with greater offset.

Furthermore, a single deposition aperture located off-center between two exhaust channels or two regions of exhaust channels generally will result in an asymmetric deposition profile. For example, FIGS. 9 and 10 show example deposition profiles resulting from aperture sections 1 and 3, respectively, in the example arrangement shown in FIG. 8C. These skewed profiles have relatively steep sidewalls on one side of the resulting deposition profile. The difference in skewness (shown as positive and negative in FIGS. 9 and 10) of such asymmetric deposition profiles may be combined by using a deposition nozzle as shown in FIG. 8C to provide a trapezium deposition profile with limited base width. Specifically, the combination of skewed profiles as shown may result in a platykurtic profile having desirable dimensions, provided the distance between the profiles is chosen correctly. Accordingly, in some embodiments the arrangement of deposition nozzle as shown in FIG. 8C provides a preferred geometry to deposit the strongest difference in skew for an asymmetric profile.

As previously noted, the example nozzle arrangements in FIGS. 8A-8B may include a deposition aperture section 2 that is omitted from an arrangement as shown in FIG. 8C. This aperture section generally will deposit a Gaussian profile in the middle of the combined profile, with a wider, more symmetric deposition pattern. Such a deposition profile may be used to fill a dip between the two skewed asymmetrical profiles that result from deposition through aperture areas 1 and 3.

In some embodiments, the deposition aperture areas 1 and 3 in an arrangement as shown in FIGS. 8C and 16A may nearly touch in the Y direction. That is, the two areas may be arranged that there is a relatively short or zero distance between the closest points of the two areas, such that they are or operate as two separate apertures within the deposition device. Due to the proximity of the aperture areas, there is an area between where deposition flows out of the aperture areas interact. This interaction, which may be referred to as "short-cutting," may cause an increased deposition in the central region of the nozzle arrangement, resembling the effect of an actual deposition aperture 2 disposed between apertures 1 and 3. In effect, the removal of deposition flow towards the most outer-located exhaust may be partially or entirely blocked by the other deposition aperture area. This may create a local area with increased efficiency, and thus a higher local deposition profile. Simulations also indicate that for some nozzle dimensions, the absence of a physical aperture 2 may still result in an additional "filling" effect in between the two dips in the profiles resulting from the two deposition apertures 1 and 3 as previously disclosed.

As the dimensions of aperture areas 1 and 3 are increased along the y-axis, i.e., along the printing direction, the effect of this fill-in may be less pronounced. After a certain length, the addition of a physical deposition aperture area 2 may be desirable or required to fill in the resulting dip in between the profiles from the areas 1 and 3.

FIGS. 11-12 show simulation results for the nozzle and exhaust channel arrangements illustrated in FIG. 8A-8C, respectively. FIGS. 11A-11C, respectively, show the partial contributions in the x-direction at different y-sections. FIGS. 12A-12C show, respectively, the weighted sum of the profiles, i.e., the expected deposition profiles (with substrate surface at the top). Notably, the results indicate that the arrangement shown in FIG. 8C also delivers a small symmetric Gaussian distribution in the center due to the cross-talk at the intersection plane of the two separate nozzle sections.

FIG. 16B shows deposition profiles generated by the upper half of the depositor arrangement shown in FIG. 16A. Only organic material originating from the top delivery aperture appears in this distribution. Material from the lower delivery aperture is omitted. The distribution is analogous to the profile plotted in FIG. 10. The center of the top delivery aperture is offset 1604 from that the bottom delivery aperture by 20, 30, 40, and 50 μm for 9 sccm (1606) and 18 sccm (1607) exhaust flows. This is consistent with the simulation results shown in FIGS. 11-12. The asymmetry of the delivery aperture placement between the exhaust apertures generates a deposition profile that is lopsided relative to that of a symmetric depositor. Maximum deposition is skewed towards the side where the delivery and exhaust apertures are close, and the deposition profile has a longer tail on the side further from the exhaust.

The thickness profile of the feature generated by the whole depositor depicted in FIG. 16A is shown in FIG. 17A (9 sccm exhaust flow) and 17B (18 sccm exhaust flow). Deposition from the top delivery aperture shown in FIG. 16B is summed to an analogous distribution generated by the bottom delivery aperture for a variety of offsets. The thickness profiles generated by split depositors with 20 μm (1701), 30 μm (1702), 40 μm (1703), and 50 μm (1704) offsets feature flatter tops than a single aperture depositor (1705), while showing a similar degree of sidewall sharpness. The FWSM, uniformity, and deposition rate for these designs are shown in Table I. Printing resolution generally improves with increased exhaust flow, but this is at the expense of decreased deposition rate since more of the organic vapor leaves through the exhausts. Deposition rate improves with offset width due to the increased material utilization efficiency from long DE spacer. Width increases linearly with offset, as expected. Uniformity also increases since the tops of the profiles become flatter with greater offset between their component maxima. Lower exhaust flows also improve uniformity, although this is at the expense of increased width. These effects are summarized in Table I.

TABLE I

| Offset | FW5M (μm) | | Uniformity (%) | | Dep. Rate (Arb.) | |
|---|---|---|---|---|---|---|
| (μm)\Exhaust | 9 sccm | 18 sccm | 9 sccm | 18 sccm | 9 sccm | 18 sccm |
| 0 | 112 | 87.4 | 71.0 | 29.2 | 28,500 | 10,900 |
| 20 | 134 | 108 | 82.4 | 66.2 | 34,800 | 15,100 |
| 30 | 145 | 118 | 90.0 | 80.8 | 37,300 | 16,400 |
| 40 | 154 | 129 | 96.5 | 90.8 | 42,000 | 17,900 |
| 50 | 166 | 140 | 97.5 | 96.8 | 43,500 | 19,800 |

FIG. 18 shows a cross section of a stagnation surface 1801, i.e., a region where the velocity of gas in the x direction is zero and the direction of flow reverses, in the plane of the substrate for the case of 9 sccm exhaust, 50 μm offset, and side fed confinement 1802. The lighter closed contours represent the intensity of organic vapor deposition on the substrate, with the innermost contours 1803 receiving the most material. Deposition becomes negligible beyond the outermost contour 1804. The regions covered by the delivery and exhaust apertures are shaded and the axes are ruled in microns. The width of the deposition region corresponds well to the width of the outer stagnation surface contour 1805.

Flow between the stagnation surface and the inner edge of the exhaust aperture comes from the delivery aperture. Notably, the stagnation surface tends towards the outer edge of the exhaust aperture 1806 when it is adjacent to the narrow delivery-exhaust DE spacer, and tends towards the inner edge of the aperture 1807 when it is adjacent to the wide DE spacer. This is because the closer exhaust aperture draws a greater fraction of the flow from each delivery aperture. The middle section of the stagnation surface runs underneath both delivery apertures. While the outer sections represent the edge of the deposition zone, the inner section crosses through the regions of fastest deposition under each component of the split delivery aperture. The stagnation plane passes through the center of the delivery flow, where flow is directed vertically downward. Confinement gas should be fed from the sides, as opposed to the ends, of the depositor to ensure the most even possible confinement flow into the exhausts. Well confined and uniform organic vapor deposition thus may be achieved if the outer regions of the stagnation surface remain parallel to the exhaust apertures along the full length of the depositor.

Micronozzle arrays containing split aperture depositors can be readily fabricated by a variety of techniques. For example, arrays as disclosed herein may be fabricated by bonding SI wafer pairs with arrays of trenches on their surfaces formed by deep reactive ion etching. Bonding the wafer pair creates closed channels. A wafer pair is diced to form individual micronozzle arrays with depositors along their edges. The apertures of the depositors are defined by the intersection of a channel and a dicing line. Such a process is described in greater detail in U.S. application Ser. No. 14/464,3887, filed Mar. 10, 2015 (U.S. Pub. No. 2015/0376787). Continuous apertures that are symmetric about the bond line, such as the exhaust apertures, are formed from mirror image trenches that overlay each other at dicing line. Conversely, apertures that are only present on one side of the bond line are created from trenches that do not overlay each other. Each aperture of the split delivery aperture pair is defined along the bond line by an unetched wafer surface and around the rest of its perimeter by an etched trench in the etched surface of the opposite wafer. The trench centerlines are separated from each other by the desired aperture offset distance.

In an embodiment, an optimized split depositor has two 15×200 μm apertures. The apertures are arranged end to end with centerlines separated by an offset of 40 μm, in the same basic arrangement as shown in FIG. 16A. The delivery apertures are surrounded by a pair of 30×500 μm exhaust apertures. The spacers between the exhaust and delivery apertures are 15 μm on the narrow side and 55 μm on the wide side. Confinement gas is fed from the sides of the depositor through distribution channels between depositors arranged in a linear array.

As disclosed above, embodiments disclosed herein may decrease process time since desired deposition profiles may require only a single pass per line of material to be deposited, allowing for greater distances to be covered per nozzle in the same time than would be achievable using conventional techniques. Furthermore, the accuracy required for nozzle positioning according to embodiments disclosed herein does not require as accurate repeatability as conventional techniques, in which two or more passes are used and accordingly a relatively high overlay accuracy is needed. Embodiments disclosed herein also may provide for more efficient material use. Because larger distance between a deposition channel and an exhaust channel arranged on one side of the nozzle may be used, the overall deposition efficiency of the nozzle (i.e. the amount of organic material present in the deposition flow exiting the nozzle that ultimately is deposited on the substrate) will be higher than in conventional arrangements, because the material has more chance to interact with the substrate and before it is removed via the exhaust. Furthermore, the disclosed method reduces the interval between the initiation and completion of emissive layer deposition for each section of substrate, since a uniform deposition can be performed in fewer passes. This may improve device lifetime.

Experimental

Depositors were simulated by computational fluid dynamics (CFD) in COMSOL MultiPhysics 5.2. A laminar flow of 6 sccm of helium was fed into the delivery aperture or aperture cluster. The exhaust boundary condition was also specified as a laminar flow rate. The micronozzle array was heated to 250° C. and the substrate was at 20° C. The micronozzle array surface and substrate were separated by a fly height of 50 μm and a millimeter square region surrounding the depositor was simulated. The pressure of the helium or argon ambient surrounding the simulated volume was 200 Torr. Gas mixing was simulated using COMSOL's Transport of Concentrated Species model for delivery and confinement gasses of different species. Transport of organic vapor through the simulated region was solved with the steady state convection-diffusion equation. Diffusivity of the gas mixture was calculated from kinetic theory of gasses and the model of Fairbanks and Wilke (1950). The simulated geometry was that of the preferred embodiment described in paragraph 81, except the width of the larger DE spacer was changed between cases to vary the offset between the top and bottom delivery apertures of the depositor.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating a deposition device, the method comprising:

dicing a wafer pair to form micronozzle array channels comprising a plurality of deposition apertures along the edges of each wafer, each aperture being defined by the intersection of a channel and a dicing line; and bonding the wafer pair to form a deposition nozzle comprising:

a first exhaust aperture;

a second exhaust aperture;

a first deposition aperture disposed between the first exhaust aperture and the second exhaust aperture and closer to the first exhaust aperture than the second aperture; and a second deposition aperture disposed between the first exhaust aperture and the second exhaust aperture and closer to the second exhaust aperture than the first exhaust aperture;

wherein the second deposition aperture is offset from the first deposition aperture along an axis of the nozzle;

wherein, for any line drawn between and perpendicular to the first exhaust aperture and the second exhaust aperture, the line crosses no more than one of the first deposition aperture or the second deposition aperture; and wherein there are no more than two deposition apertures disposed between the first exhaust aperture and the second exhaust aperture.

2. The method of claim 1, wherein, subsequent to bonding the wafer pair to form a deposition nozzle, the first deposition aperture and the second deposition aperture have the same dimensions.

3. The method of claim 2, wherein each of the first deposition aperture and the second deposition aperture are rectangular.

4. The method of claim 1, wherein, subsequent to bonding the wafer pair to form a deposition nozzle, the first exhaust aperture and the second exhaust aperture are continuous.

5. The method of claim 1, further comprising fabricating the channels using deep reactive ion etching.

6. The method of claim 1, wherein dimensions of the micronzzle array channels are defined by thicknesses of channels etched into the wafer pair.

7. The method of claim 1, wherein dimensions of the delivery apertures are defined by intersections of the channels within the wafer and a lower edge of the wafer formed by the step of dicing the wafer pair.

\* \* \* \* \*